US006433643B1

(12) United States Patent
Opsahl et al.

(10) Patent No.: US 6,433,643 B1
(45) Date of Patent: Aug. 13, 2002

(54) REDUCED LATENCY DIFFERENTIATOR

(75) Inventors: Paul L. Opsahl, Cedar Rapids; Daniel J. Talley, Marion, both of IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/511,010

(22) Filed: Feb. 22, 2000

(51) Int. Cl.[7] ............................................. H03L 7/183
(52) U.S. Cl. ...................... 331/1 A; 331/16; 341/143; 377/48
(58) Field of Search .................. 331/1 A, 16; 341/143; 375/243, 244; 377/48

(56) References Cited

U.S. PATENT DOCUMENTS

| 4,609,881 A | * | 9/1986 | Wells | 331/1 A |
| 5,038,117 A | * | 8/1991 | Miller | 331/16 |
| 5,903,194 A | * | 5/1999 | Opsahl et al. | 331/1 A |

OTHER PUBLICATIONS

IEEE Transaction On Instrumentation And Measurement (Miller and Conley,) vol. 40, No. 6, Jun. 1991, A Multiple Modulator Fractional Divider, pp. 578–583.*

* cited by examiner

Primary Examiner—Arnold Kinkead
(74) Attorney, Agent, or Firm—Nathan O. Jensen; Kyle Eppele

(57) ABSTRACT

A method to reduce latency in an n'th order differentiator and in a frequency synthesizer having a MASH structure of sigma-delta modulators includes characterizing the differentiator according to its z-transform transfer function. The transfer function polynomial is expanded using Horner's Rule. Realizing the expanded polynomial in hardware reduces latency in both the differentiator and the frequency synthesizer. An n'th order differentiator utilizes parallel inputs in adders and latches and implicit multiplication at adder inputs to realize the z-transform transfer function using Horner's Rule. An n'th order MASH structure of sigma-delta modulators has n'th differentiators, each differentiator implementing a z-transform polynomial transfer function expanded using Horner's Rule.

31 Claims, 14 Drawing Sheets

$$Y = Y_0(1-z^{-1})^0 + Y_1(1-z^{-1})^1 + Y_2(1-z^{-1})^2 + Y_3(1-z^{-1})^3 + Y_4(1-z^{-1})^4 + Y_5(1-z^{-1})^5 + Y_6(1-z^{-1})^6 + Y_7(1-z^{-1})^7 \quad (14)$$

$$Y_0(1-z^{-1})^0 = Y_0 \quad (0)$$

$$Y_1(1-z^{-1})^1 = Y_1(1-z^{-1}) \quad (1)$$

$$Y_2(1-z^{-1})^2 = Y_2(1-2z^{-1}+z^{-2}) \quad (2)$$

$$= Y_2(1+(-2+z^{-1})z^{-1}) \quad (3)$$

$$Y_3(1-z^{-1})^3 = Y_3(1-3z^{-1}+3z^{-2}-z^{-3}) \quad (4)$$

$$= Y_3(1+(-3+(3-z^{-1})z^{-1})z^{-1}) \quad (5)$$

$$Y_4(1-z^{-1})^4 = Y_4(1-4z^{-1}+6z^{-2}-4z^{-3}+z^{-4}) \quad (6)$$

$$= Y_4(1+(-4+(6+(-4+z^{-1})z^{-1})z^{-1})z^{-1}) \quad (7)$$

$$Y_5(1-z^{-1})^5 = Y_5(1-5z^{-1}+10z^{-2}-10z^{-3}+5z^{-4}-z^{-5}) \quad (8)$$

$$= Y_5(1+(-5+(10+(-10+(5-z^{-1})z^{-1})z^{-1})z^{-1})z^{-1}) \quad (9)$$

$$Y_6(1-z^{-1})^6 = Y_6(1-6z^{-1}+15z^{-2}-20z^{-3}+15z^{-4}-6z^{-5}+z^{-6}) \quad (10)$$

$$= Y_6(1+(-6+(15+(-20+(15+(-6z^{-1})z^{-1})z^{-1})z^{-1})z^{-1})z^{-1}) \quad (11)$$

$$Y_7(1-z^{-1})^7 = Y_7(1-7z^{-1}+21z^{-2}-35z^{-3}+35z^{-4}-21z^{-5}+7z^{-6}-z^{-7}) \quad (12)$$

$$= Y_7(1+(-7+(21+(-35+(35+(-21+(7-z^{-1})z^{-1})z^{-1})z^{-1})z^{-1})z^{-1})z^{-1}) \quad (13)$$

REDUCED LATENCY DIFFERENTIATOR

BACKGROUND OF THE INVENTION

A. Field of the Invention

The present invention relates to a MASH structure of sigma-delta modulators. More specifically, the present invention relates to a cascade of discrete-time differentiators which can be used within a MASH structure of sigma-delta modulators.

B. Problems in the Art

The use of a MASH structure of sigma-delta modulators is known in the art for fractional-N frequency synthesis. The role of sigma-delta modulation, as used in frequency synthesis, is to provide a means for fractional frequency resolution and to shape a resultant noise power density out of a desired frequency spectrum. An example of the use of a MASH structure of sigma-delta modulators is disclosed in U.S. Pat. No. 5,038,117, the disclosure of which is hereby incorporated by reference in its entirety. It is understood that increasing the order of the noise shaping function by increasing the number of sigma-delta modulators in the MASH structure is useful for reducing the quantization noise within the frequency spectrum of interest.

There are MASH structure designs currently in the art which can successfully implement low-order noise-shaped sigma-delta modulation. However, as the order of the noise shaping function is increased, latency problems prevent the prior art structures from being implemented successfully. In this context, there are two types of latency associated with the differentiators in the MASH structure. The first type is a time delay due to the insertion of a flip-flop in the signal path. A flip-flop circuit delays an incoming signal by one sample period. The second type of latency is propagation delay. Propagation delay is primarily due to two components. The first component is due to the limited bandwidth of the semiconductor process. The second component is related to the number of circuit functions, such as adders, that a signal must propagate through. While the semiconductor process is generally fixed for a given application, the circuit configuration can be modified to compensate for the semiconductor process being targeted.

One method of compensating for propagation delay is to insert unit delay functions within the critical signal path of the differentiators. The insertion of unit delay requires additional hardware and causes the signal being processed to be shifted in phase. When sigma-delta modulation is used in a control loop such as a phase-locked loop, this additional phase shift leads to instability. To compensate for such instability, the bandwidth of the control loop must be reduced. In many cases, bandwidth reduction is undesirable due to a corresponding reduction in the agility of the control loop.

The present invention discloses a method and apparatus which overcomes the latency problems associated with higher order noise shaping in MASH structures without using additional unit delays. By characterizing the transfer function of a discrete-time differentiator in the z-domain, expressing the z-domain transfer function of a cascade of multiple discrete-time differentiators as a polynomial in z, expanding the polynomial in z using Horner's Rule, and implementing the resultant structure in hardware, an improved MASH structure of sigma-delta modulators can be constructed. By implementing a design based on the expanded form of the polynomial expression and utilizing implicit multiplication, a high-order MASH structure of sigma-delta modulators can be implemented that does not exhibit the latency problems associated with prior art.

Although the present invention will be discussed primarily with respect to higher order MASH architectures, it will be readily apparent to those skilled in the art that the design methodology can be extended to low-order MASH architectures as well. Therefore, the present invention is not intended to be limited simply to high-order MASH architectures, but applies to a MASH structure of sigma-delta modulators in general, and more specifically to a cascade of discrete-time differentiators which can be used within the MASH structure of sigma-delta modulators.

C. Features of the Invention

A primary feature of the present invention is a method for implementing a high-order MASH structure of sigma-delta modulators which reduces latency problems in the prior art.

Another feature of the present invention is a high-order MASH structure of sigma-delta modulators which operates at higher speeds than those known in the prior art.

Another feature of the present invention is a MASH structure of sigma-delta modulators which is implemented by realizing the z-domain transfer function of a cascade of multiple differentiators as an expanded polynomial expression using Horner's Rule.

Another feature of the present invention is a cascade of multiple discrete-time signal differentiators that utilize implicit multiplication in an adder to realize coefficients.

Another feature of the present invention is a cascade of multiple discrete-time signal differentiators that use two's complement number representation to realize negative coefficients.

Another feature of the present invention is a cascade of multiple discrete-time signal differentiators wherein a signal must propagate through only one circuit function per sample period.

Another feature of the present invention is a MASH structure of sigma-delta modulators which can be used to control a frequency divider or a phase-locked loop.

Yet another feature of the present invention is a cascade of multiple discrete-time signal differentiators wherein the input signal is input in multiple places in the differentiator.

These, as well as other features of the present invention, will be apparent from the following detailed description and claims in conjunction with the accompanying drawings.

SUMMARY OF THE INVENTION

A method to reduce latency in an n'th order differentiator includes characterizing the z-domain transfer function of a cascade of multiple discrete-time differentiators according to a polynomial expansion using Horner's Rule. Realizing the expanded form of the polynomial expression in hardware reduces latency.

An n'th order differentiator comprises at least one latch and at least one adder, each having an input, with all adder inputs arranged in parallel. The bit-position inputs at the adders are determined according to the coefficients of the z-domain polynomial transfer function of the differentiator.

A method to reduce latency in a phase-locked loop frequency synthesizer that includes a MASH structure of n sigma-delta modulators having n accumulators comprises implementing an expanded polynomial z-domain transfer function for each of the n differentiators in the MASH structure.

A MASH structure of n sigma-delta modulators is realized by implementing the n differentiators within the MASH structure according to the expansion of the z-domain polynomial transfer function of a cascade of multiple discrete-signal differentiators using Horner's Rule.

BRIEF DESCRIPTION OF THE DRAWINGS

FIG. 2 shows a series of equations for transfer functions of zero through seventh order differentiators and also shows the form of those transfer functions expanded using Horner's Rule, which is used to implement the differentiators in hardware.

DETAILED DESCRIPTION OF AN EXEMPLARY EMBODIMENT

Figure 1:
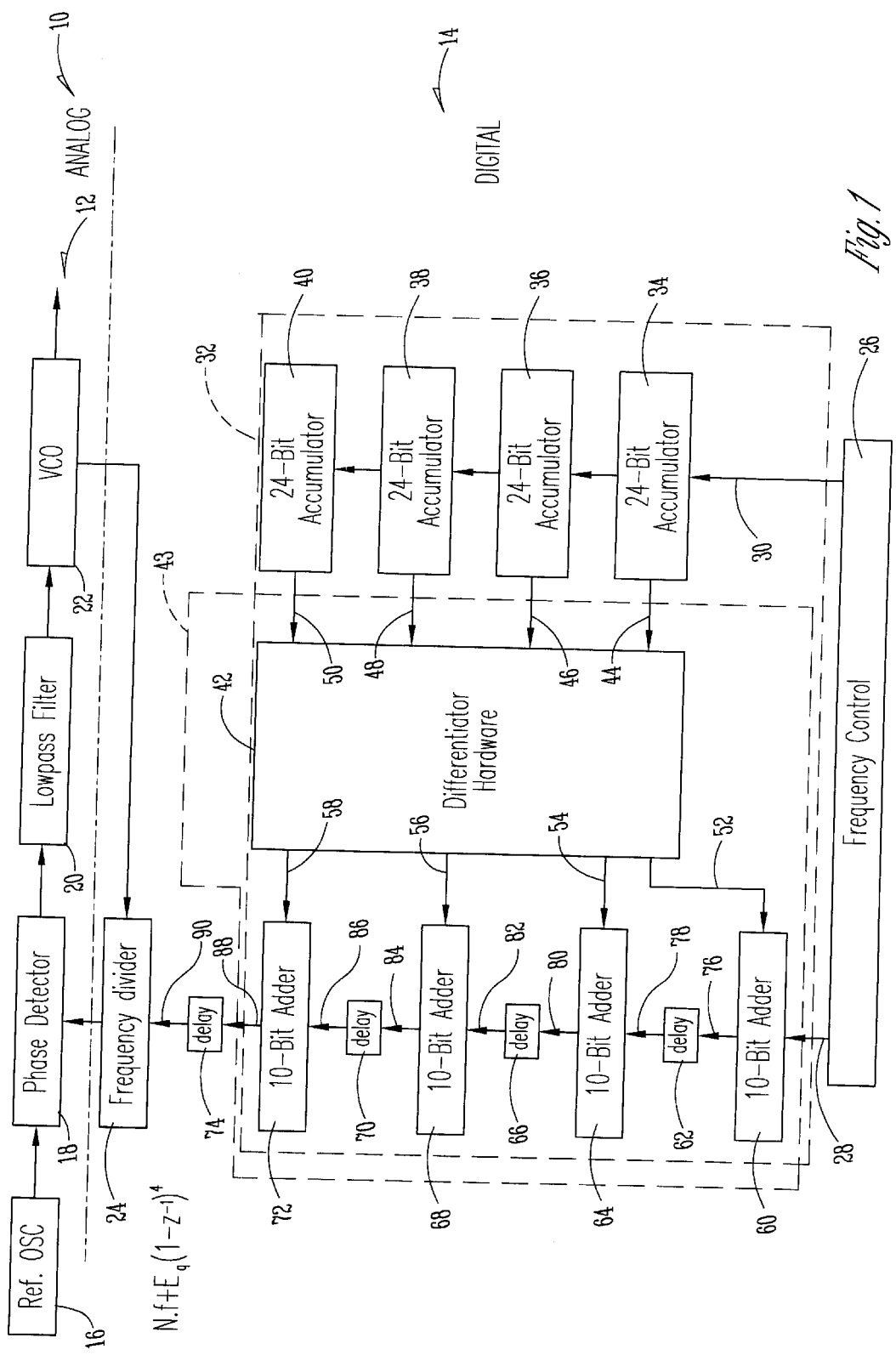
FIG. 1 is a block diagram of a fractional frequency synthesizer that utilizes differentiators implemented according to the present invention.

FIG. 1 shows a block diagram of a frequency synthesizer 10. The frequency synthesizer 10 utilizes fractional-N techniques to synthesize output signals having a frequency which is a rational multiple of a reference frequency. Fractional-N synthesizers are known in the art and are explained in incorporated U.S. Pat. No. 5,038,117. Therefore, only a brief discussion of the frequency synthesizer 10 will be given.

The frequency synthesizer 10 includes a phase-locked loop (PLL) 12. Frequency synthesizer 10 also includes frequency divider control circuit 14. Phase-locked loop 12 includes a phase-detector 18, a lowpass filter 20, a voltage controlled oscillator (VCO) 22, and a frequency divider 24. A reference oscillator 16 is an input into the PLL 12. As is understood in the art, the frequency divider control circuit 14 produces a divisor for the frequency divider 24. The frequency divider 24 divides the output frequency of the VCO 22 and outputs this divided frequency to the phase-detector 18. The phase-detector 18 outputs a voltage which is dependent on the difference in phase between thee output signal of the frequency divider 24 and the output signal of the reference oscillator 16. In practice, a scalar could be used between the phase-detector 18 and the lowpass filter 210. The output frequency of the VCO 22 is a rational multiple of the frequency of the reference oscillator 16. This is all understood within the art.

The frequency control 26 is comprised of ten integer control bits 28 and twenty-four fractional control bits 30. The twenty-four fractional control bits 30 are output to the first accumulator 34 of the MASH structure of sigma-delta modulators 32. In FIG. 1, the MASH structure of sigma-delta modulators 32 is a fourth order modulator, wherein the order of a MASH structure of sigma-delta modulators is determined from the number of accumulators 34, 36, 38, 40. The highest order differentiator in FIG. 1 is a third order differentiator. The MASH structure of sigma-delta modulators 32 includes four twenty-four bit accumulators 34, 36, 38, 40 and differentiator hardware 42. The carry bits (CB) 44, 46, 48, 50 of the four accumulators 34, 36, 38, 40 are output to the differentiator hardware 42. The carry bits 44, 46, 48, 50 correspond to input signals $Y_0$ through $Y_3$ (FIG. 2). The outputs 52, 54, 56, 58 of the differentiator hardware 42 are sequentially added, with the integer control bits 28 being added, in the first adder 60, to the output 52 oft the first differentiator, this sum being added to the output 54 of the second differentiator, etc. Each successive ten-bit adder 64, 68, 72 sums the previous adder's output (delayed by one sample period) with the output of the next differentiator. Delay elements 62, 66, 70 are used to synchronize signals. As will be explained in more detail, the differentiator section 43 includes the differentiator hardware 42 and the adders 60, 64, 68, and 72.

In FIG. 2, the z-domain transfer functions for zero through seventh order differentiators are shown. As is understood in the art, the z-domain transfer function for an n'th order discrete-signal differentiator can be represented in general by $$Y/X=(1-z^{-1})^n$$

where Y is the z-transform of the differentiator output signal and X is the z-transform of the differentiator input signal. Utilizing the transfer function of a single differentiator, the equations in FIG. 2 can be derived for an n'th order differentiator. Algebraically expanding the general transfer function for an n'th order differentiator into a polynomial expression using Horner's Rule and implementing hardware to realize the resulting expression yields a more efficient, reduced latency, n'th order differentiator.

FIGS. 3A–7A show zero through third, and seventh order differentiators implemented according to prior art convention. FIGS. 3B–7B show zero through third, and seventh order differentiators implemented according to the present invention. The differentiators of FIGS. 3A–7A implement the left-hand side of equations (0), (1), (2), (4) and (12), respectively, of FIG. 2. The differentiators of FIGS. 3B–7B implement the right-hand side of equations (0), (1), (3), (5) and (13), respectively. As can be understood from the equations of FIG. 2, the differentiators of FIGS. 3A–7A implement the exact same mathematical function as the differentiators of FIGS. 3B–7B. However, the implementation shown in FIGS. 3B–7B reduce latency problems and timing problems within all differentiators, especially higher order ones.

Referring again to FIG. 2, the right-hand side of equations (0), (1), (2), (4), (6), (8), (10), and (12) represent the polynomial expansion of the left-hand side of the respective equations for zero through seventh order differentiators. The right-hand side of equations (3), (5), (7), (9), (11), and (13) represent the same polynomial expressions after rearrangement according to Horner's Rule. Implementing equations (3), (5), (7), (9), (11), and (13) by realizing multiple parallel inputs to a staged adder, within the differentiator, and also by realizing the respective coefficients in each parallel input through implicit multiplication, reduces latency.

FIGS. 3A–7A and 3B–7B utilize a series of adders, the adders having inputs represented by A0, B0, A1, B1, etc. It is understood that the adder adds bit A9 to B9, A8 to B8, etc. It is also to be understood that input A0 corresponds to the input bit multiplied by $2_0$, input A1 corresponds to the input bit multiplied by $2^1$, etc. All of the adders shown in FIGS. 3–8 are conventional digital adders.

Figure 3A:
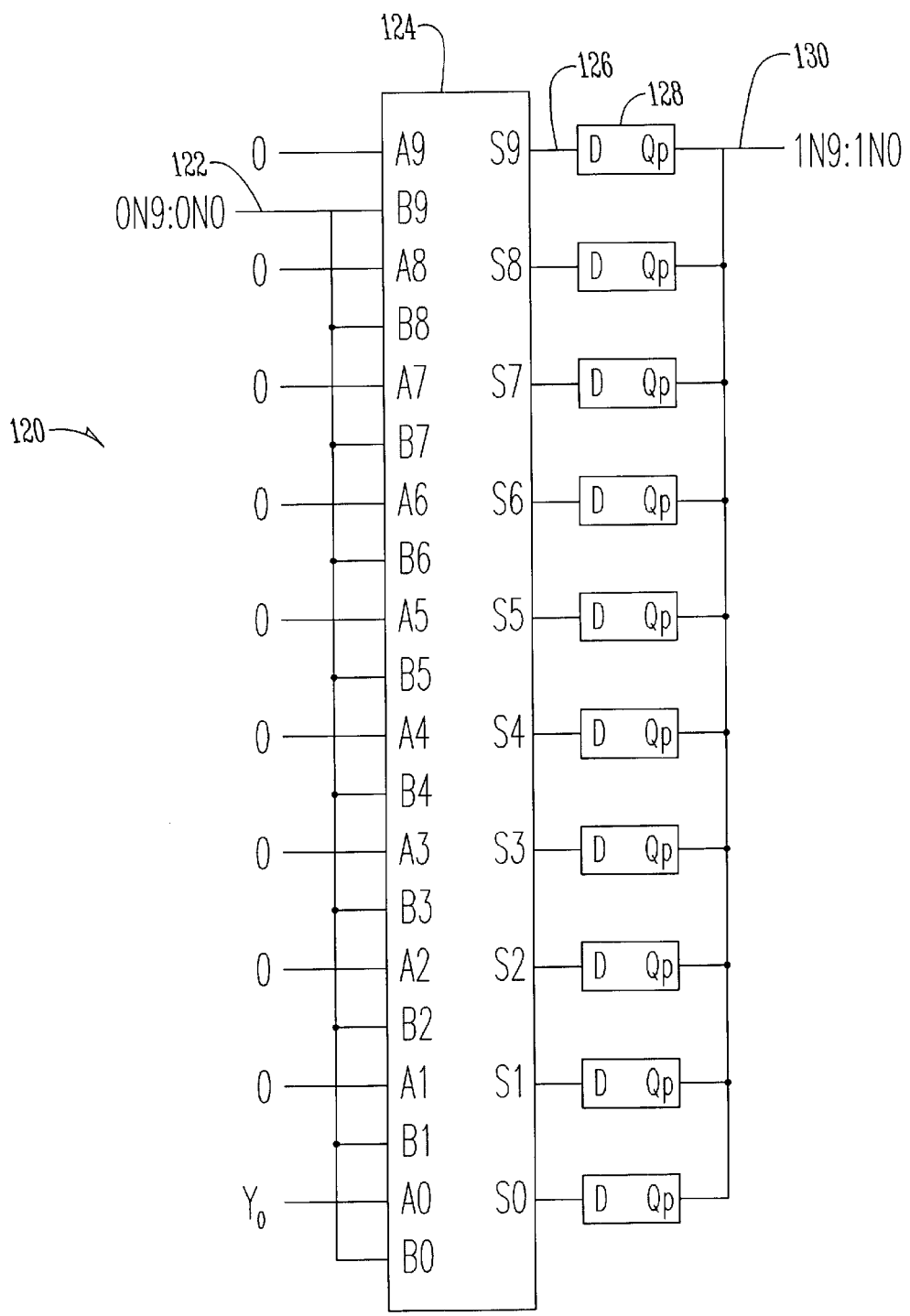
FIG. 3A is a schematic diagram of a zero order differentiator implemented according to the prior art.
Figure 3B:
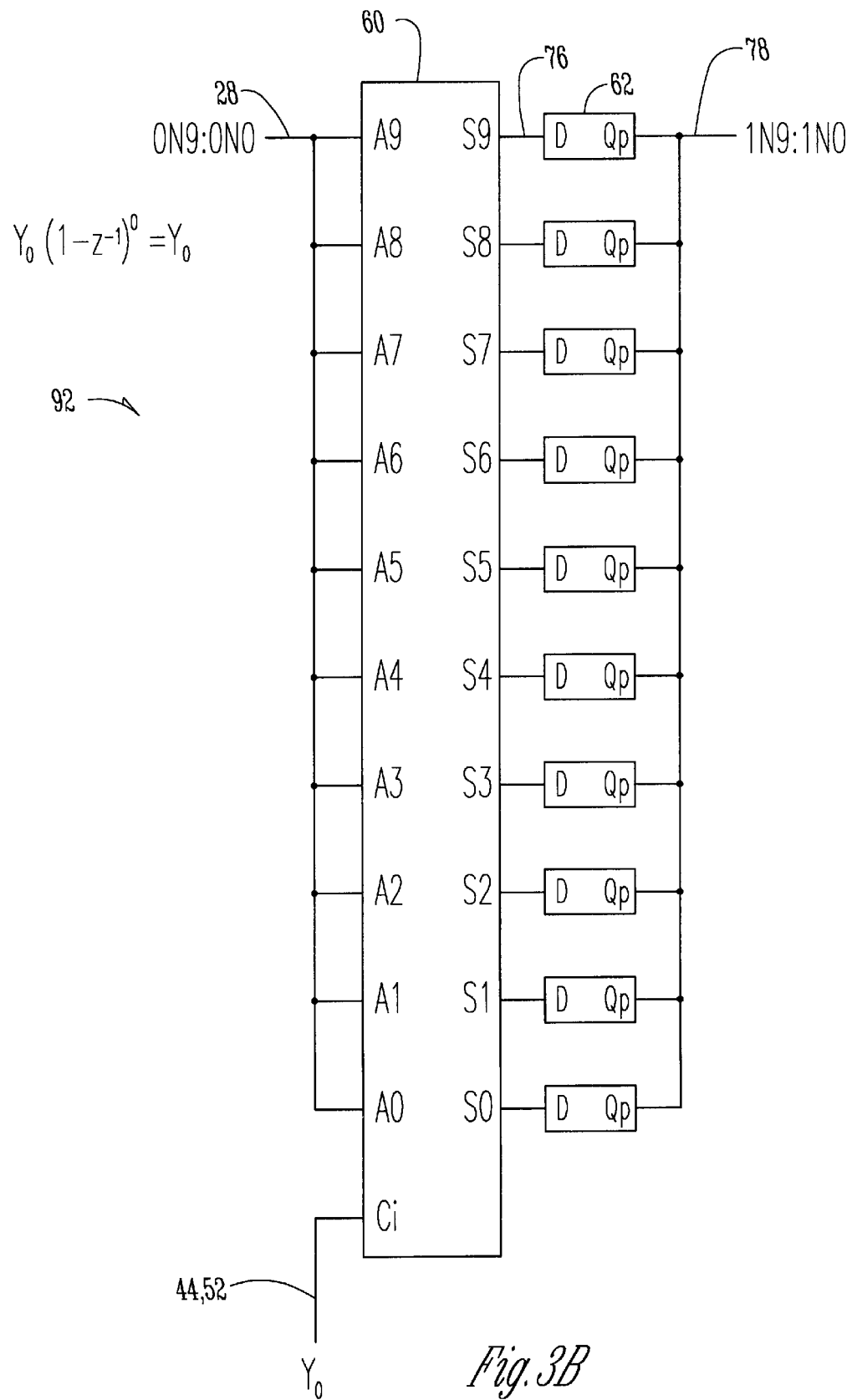
FIG. 3B is a schematic diagram of a zero order differentiator implemented according to the present invention.

FIGS. 3B–6B are schematic diagrams of the zero through third order differentiators that are utilized in FIG. 1. The differentiators of FIGS. 3B–6B implement the functions on the right-hand side of equations (0), (1), (3), and (5), respectively. The zero order differentiator 92 of FIG. 3B is not significantly different from the zero order differentiator 120 of FIG. 3A. In FIG. 3B, input signal $Y_0$ 44, 52 is summed with the integer control bits 28 (N0:N9) in adder 60. The output 76 is input into latches 62 where the signal is delayed by one sample period.

Figure 4A:
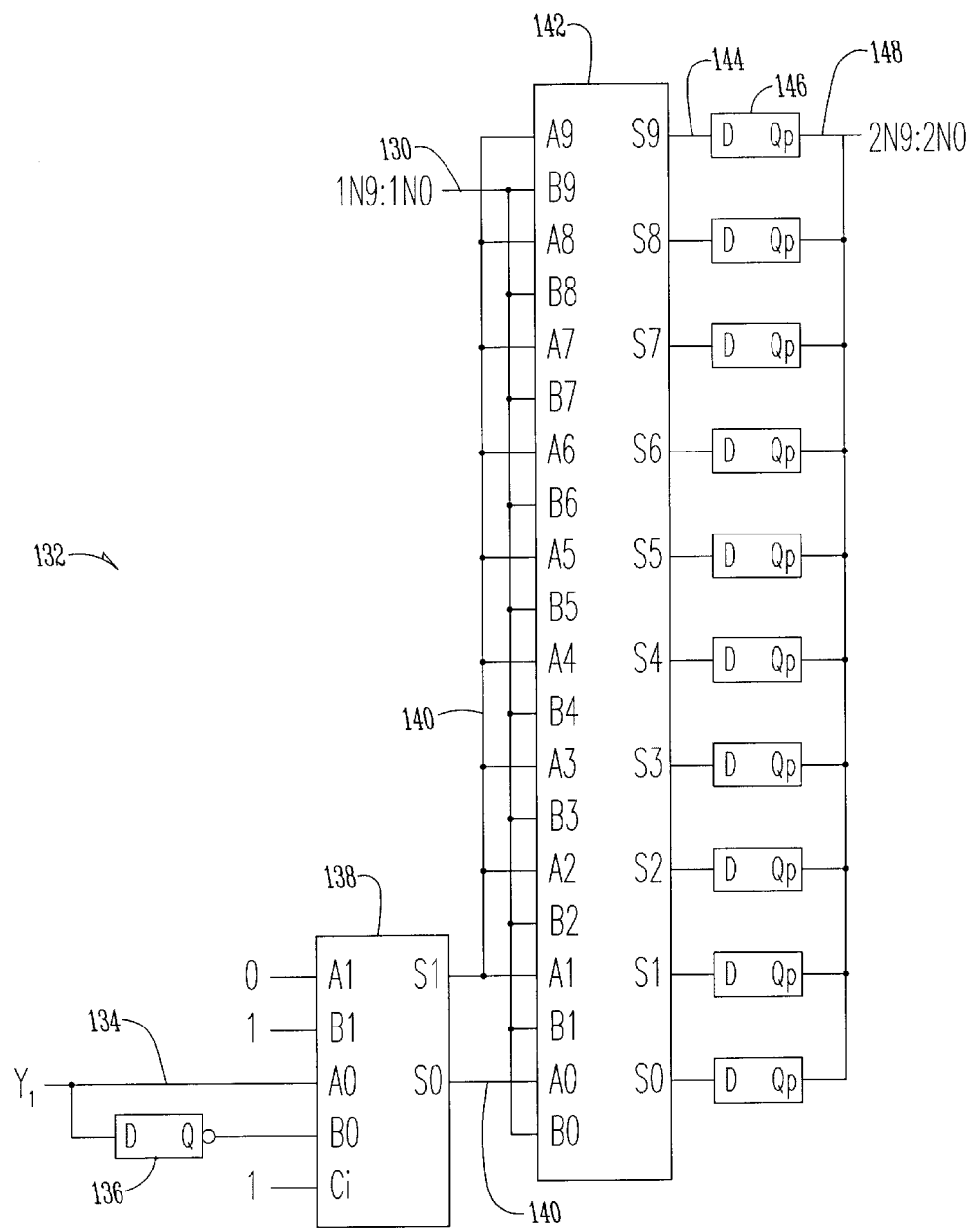
FIG. 4A is a schematic diagram of a first order differentiator implemented according to the prior art.
Figure 4B:
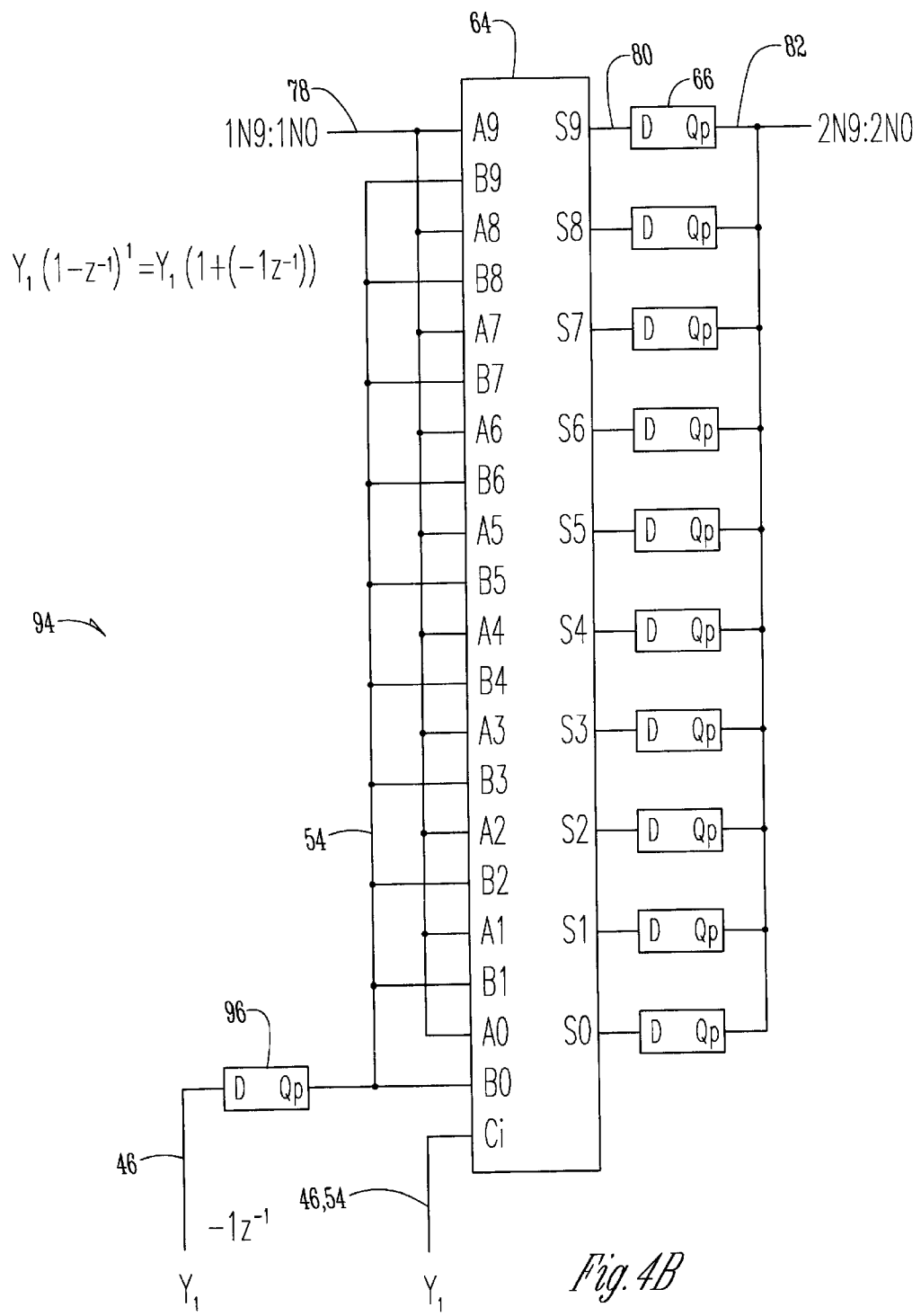
FIG. 4B is a schematic diagram of a first order differentiator implemented according to the present invention.

FIG. 4B is a schematic diagram of a first order differentiator 94 that implements the right-hand side of equation (1) of FIG. 2. Signal $Y_1$ 46 is input into latch 96 and adder 64 in parallel. Signal $Y_1$ 46 is input into adder 64 at the carry input position to realize the $+1Y_1$ term of the polynomial. The $-1Y_1z^{-1}$ term of the polynomial is realized by $Y_1$ 46 being passed first through latch 96 yielding $Y_1z^{-1}$. The negative coefficient is realized by presenting the output of latch 96 to the adder 64 using the two's complement representation of the magnitude of the coefficient. The output of the latch 96 is sign extended and therefore input into bit positions B0–B9. As will be appreciated, the output of latch 96 is a two's complement representation of $-1$, wherein $-A=\tilde{A}+1$. When the output signal at latch 96 is a 1, input bits B0–B9 will also be 1. The representation 1111111111 is $-1$ using two's complement representation. By properly selecting the input positions at adder 64, implicit multiplication is realized such that the sign and the weight of the coefficient are correct. In this manner, adder 64 sums the output signal of the first order differentiator 54 with the signal 78 derived in the previous stage. The output 80 of adder 64 is input into latches 66 where the signal is delayed by one sample period.

Figure 5A:
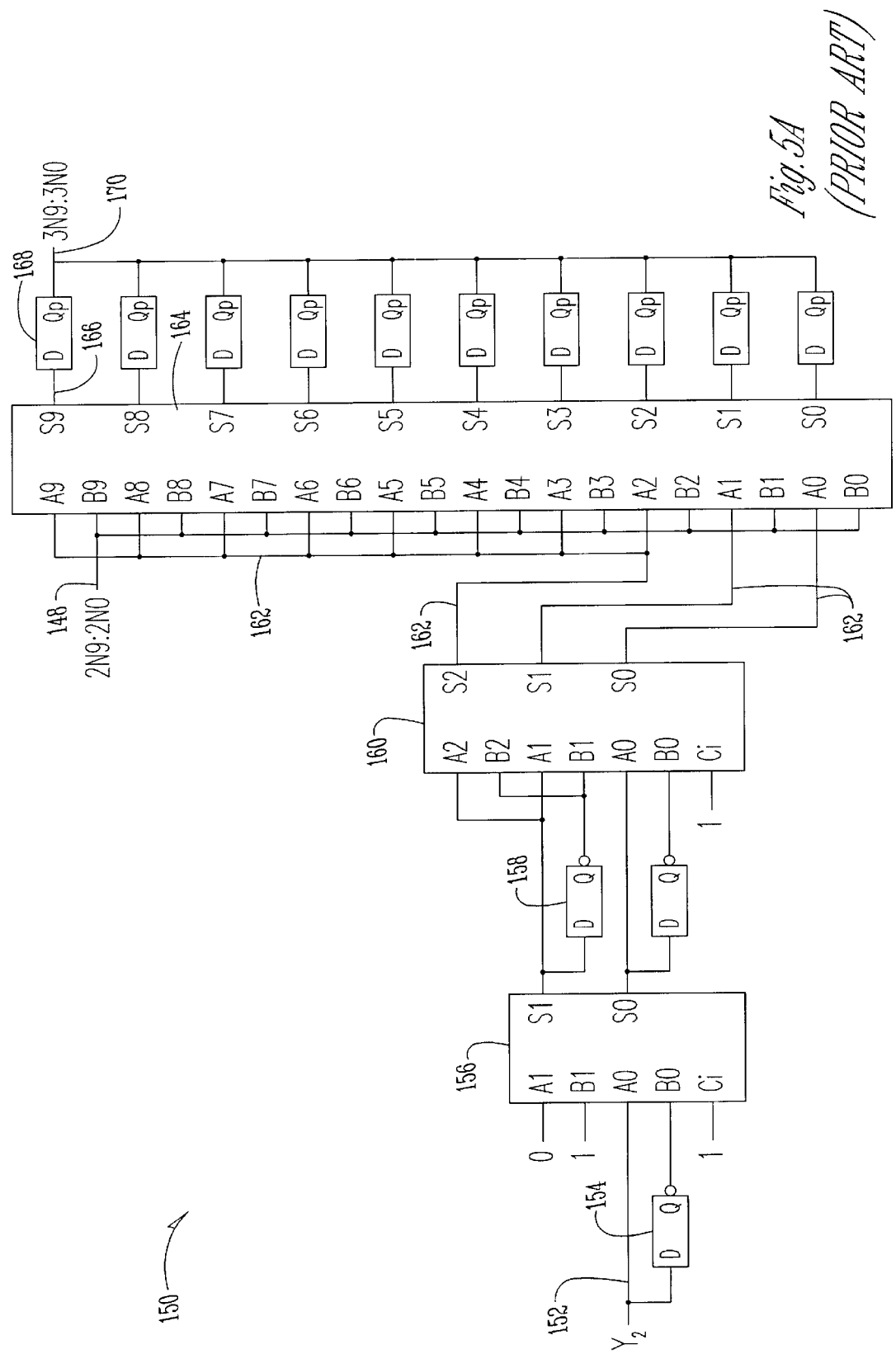
FIG. 5A is a schematic diagram of a second order differentiator implemented according to the prior art.
Figure 5B:
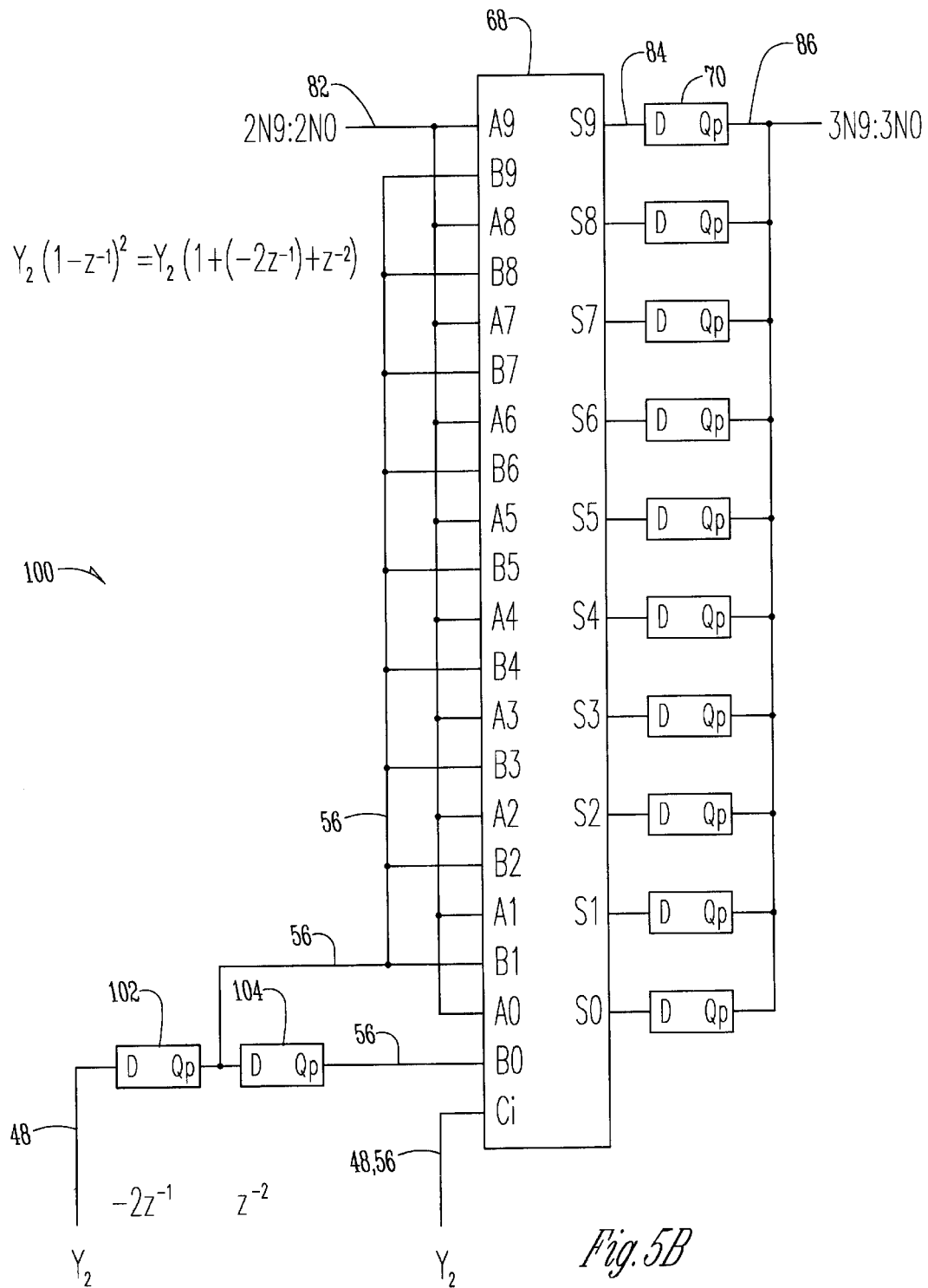
FIG. 5B is a schematic diagram of a second order differentiator implemented according to the present invention.

FIG. 5B shows a second order differentiator 100 according to the present invention. The differentiator 100 of FIG. 5B implements the right-hand side of equation (3) from FIG. 2. Signal $Y_2$ 48 is input into latch 102 and adder 68 in parallel. Signal $Y_2$ 48 is input into adder 68 at the carry input position to realize the $+1Y_2$ term of the polynomial. The $-2Y_2z^{-1}$ term of the polynomial is realized by $Y_2$ 48 being passed first through latch 102 yielding $Y_2z^{-1}$. The negative coefficient is realized by presenting the output of latch 102 to the adder 68 using the two's complement representation of the magnitude of the coefficient. The output of the latch 102 is sign extended and therefore input into bit positions B1–B9. As will be appreciated, this is the two's complement representation of $-2$, wherein $-A=\tilde{A}+1$. When the output signal at latch 102 is a 1, input bits B1–B9. will also be 1. The representation 1111111110 is $-2$ using two's complement representation. By properly selecting the input positions at adder 68, implicit multiplication is realized such that the sign and weight of the coefficient are correct. The $+1Y_2z^{-2}$ term of the polynomial is realized by further passing the output signal of latch 102 through a second latch 104 to yield $Y_2z^{-2}$. Since the coefficient of this polynomial term is unity and positive, the output signal at latch 104 is input into bit position B0 on adder 68. In this manner, adder 68 sums the output signal 56 of the second order differentiator with the signal 82 derived in the previous stage. the output 84 of adder 68 is input into latches 70 where the signal is delayed by one sample period.

Figure 6A:
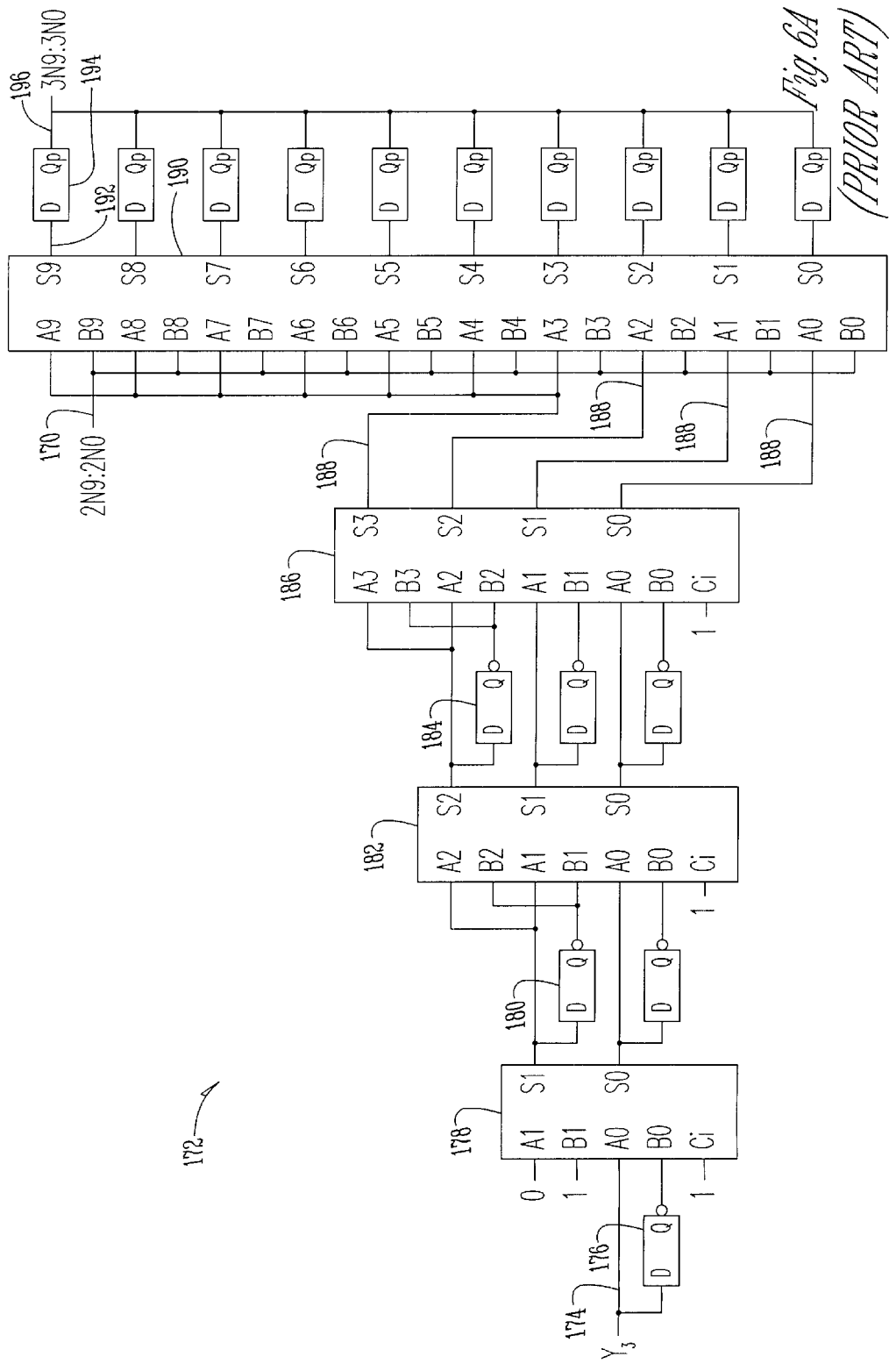
FIG. 6A is a schematic diagram of a third order differentiator implemented according to the prior art.
Figure 6B:
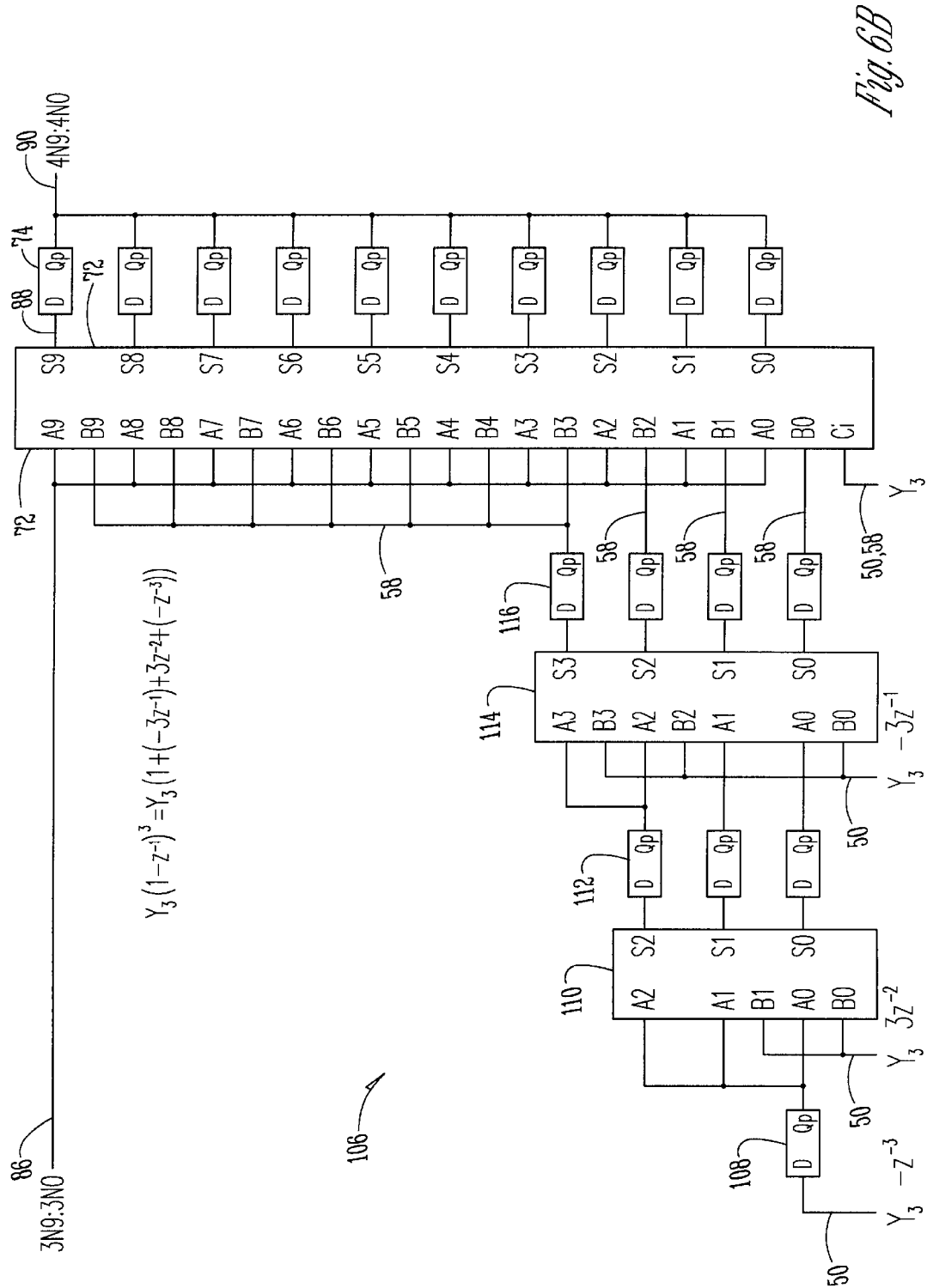
FIG. 6B is a schematic diagram of a third order differentiator implemented according to the present invention.

The third order differentiator 106 of FIG. 6B implements the right-hand side of equation (5) in FIG. 2. Signal $Y_3$ 50 is input into latch 108, adder 110, adder 114, and adder 72 in parallel. The output of the first latch 108 is $Y_3z^{-1}$. The required coefficient for this term is realized using the two's complement representation of 1 at bit positions A2, A1, and A0 on adder 110. The input $Y_3$ 50 at adder 110 corresponds to $3Y_3$ with $Y_3$ being input at bit positions B0 and B1. The output of adder 110 is $3Y_3-Y_3z^{-1}$, which is input into latches 112. The sum is delayed by one sample period in latches 112 to yield $3Y_3z^{-1} - Y_3z^{-2}$. The output signal at latches 112 is sign extended and input into adder 114. The input $Y_3$ 50 at adder 114 at bit positions B3, B2, and B0 realizes the two's complement of negative three. The output of adder 114 is $-3Y_3+3Y_3z^{-1}-Y_3z^{-2}$, which is input Onto latches 116. The sum is delayed by one sample period in latches 116 to yield $-3Y_3z^{-1}+3Y_3z^{-2}-Y_3z^{-3}$. The output signal at latches 116 is sign extended and input into adder 72 along with input $Y_3$ 50. In this manner, adder 72 sums the output signal 58 of the third order differentiator with the signal 86 derived in the previous stage.

The output 88 of adder 72 is input into latches 74 where the signal is delayed by one sample period. The output 90 of the latches 74 could either be summed with the output of a fourth order differentiator or sent to the frequency divider 24 (FIG. 1). In this case, the signal that is sent to the frequency divider 24 is $N.f+E_q(1-z^{-1})^4$. The signal 90 sent to the frequency divider is the desired signal $(N.f)$ plus quantization noise $(E_q)$ multiplied by the transfer function $(1-z^{-1})^4$ of a fourths order differentiator, wherein three of the differentiations are performed by the third order differentiator, land the fourth differentiation is attributable to accumulator 40. The noise canceling feature of a sigma-delta modulator is explained in more detail in incorporated U.S. Pat. No. 5,038,117. The quantization noise will eventually be filtered out by a lowpass filter 20 of the PLL 12.

The schematic of a zero order differentiator 120 according to the prior art is shown in FIG. 3A. Input $Y_0$ is summed with the integer control bits (0N9:0N0) in adder 124. The output 126 of adder 124 is sent to the latches 128. The output signal 130 is sent to a next summer 142 of FIG. 4A.

A first order differentiator 132 according to the prior art is shown in a schematic diagram in FIG. 4A. Input $Y_1$ 134 is input at adder 138 and inverting latch 136. The output of the inverting latch 136 is input at adder 138. The combination of adder 138 and inverting latch 136 implements the first order differentiation function of the right-hand side of equation (2) in FIG. 2. The output 144 of the adder 142 of the adder 142 is input at latch 146. The output signal 148 of latch 146 is sent to a next summer 164 of FIG. 5A.

A second order differentiator 150 according to the prior art is shown in a schematic diagram in FIG. 5A. Input $Y_2$ 152 is input at adder 156 and inverting latch 154. The combination of adder 156 and, inverting latch 154 performs the multiplication $Y_2(1-z^{-1})$. The output of adder 156 is input at adder 160 and inverting latches 158. Inverting latches 158 and adder 160 perform another differentiation on the signal. The output 162 of the adder 160 represents $Y_2(1-z^{-1})^2$. This output 162 is added to the output 148 of the first order differentiator 132 in adder 164. The output 166 of adder 164 is input into latches 168. The output 170 of latches 168 is sent to a next summer 190 of FIG. 6A.

A schematic diagram of a prior art third order differentiator 172 is shown in FIG. 6A. Input signal $Y_3$ 174 is input at adder 178 and inverting latch 176. The adder 178 along with inverting latch 176 performs a first differentiation. Adder 182 and inverting latch 180 perform a second differentiation and adder 186 and inverting latch 184 perform a third differentiation. The output 188 of adder 186 represents $Y_3(1-z^{-1})^3$. The output 188 of adder 186 is summed with the output 170 of latches 168 of FIG. 5A at adder 190. The output 192 of adder 190 is input into latch 194. The output 196 of latch 194 could either be summed with the output of a fourth differentiator or fed to the frequency divider 24.

As is apparent from an analysis of FIGS. 3A–6A, the scheme in the prior art for implementing differentiator functions is to cascade multiple differentiators one after another. This scheme performs reasonably well for lower order differentiators. However, as will be explained more fully, with increasing order a signal must pass through an increasing number of circuit functions within one clock period. For example, looking at FIG. 6A, it can be seen that signal $Y_3$ must traverse adder 178, adder 182, adder 186 and up through adder 190 in one clock period. The delays that are imposed by the adders 178, 182, 186, 190 must be taken into account when designing a higher order differentiator.

Figure 7A:
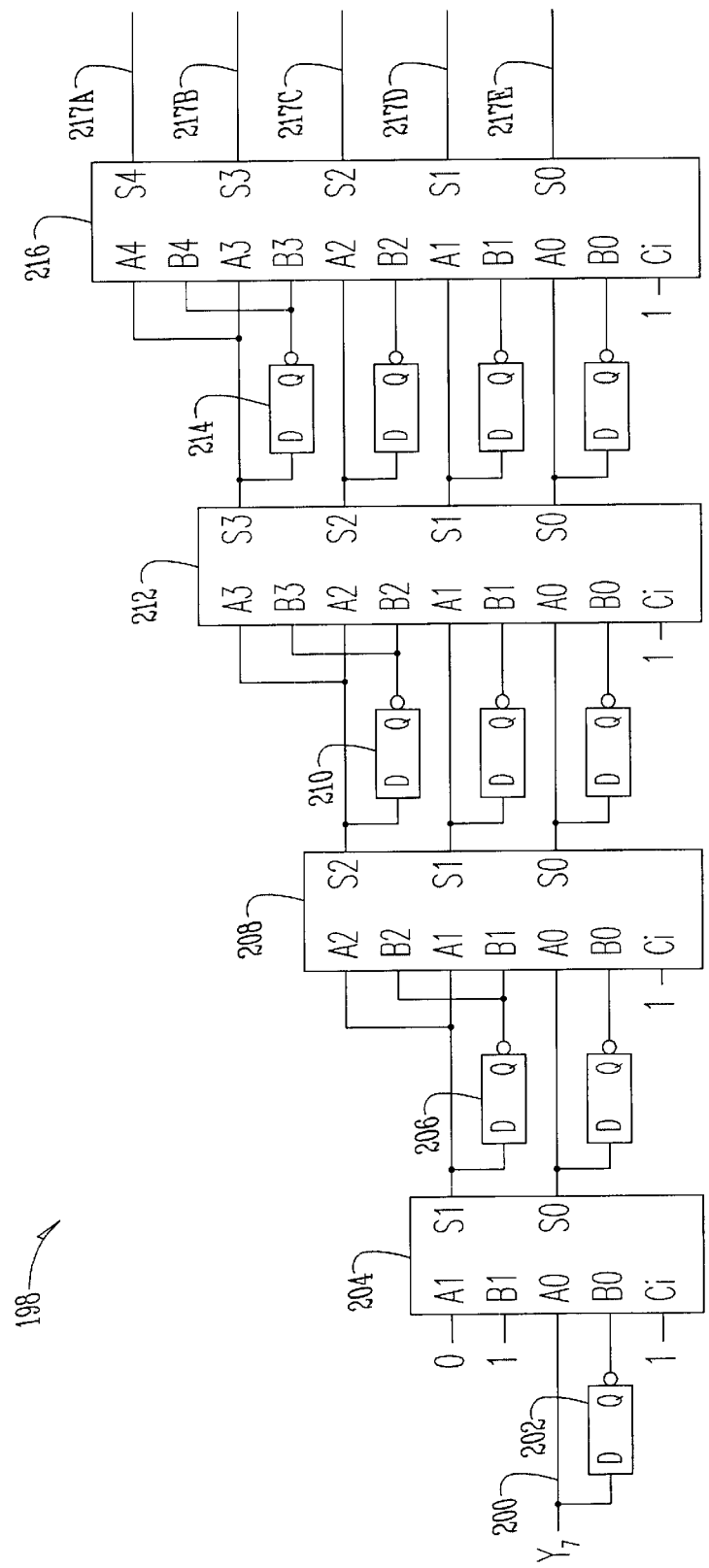
FIG. 7A is a schematic diagram of a seventh order differentiator implemented according to the prior art.
Figure 7A:
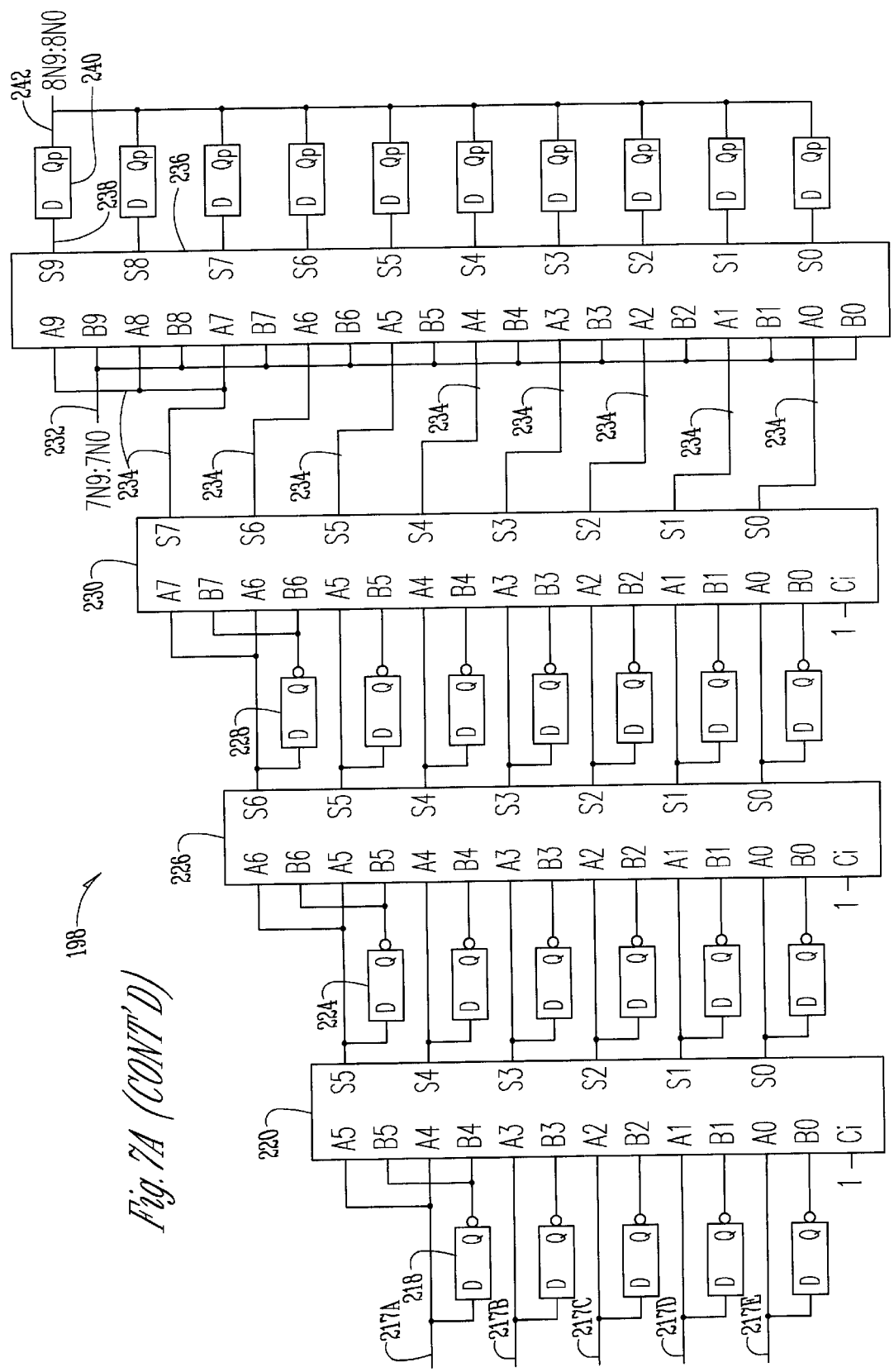

FIGS. 7A land 7B show schematic diagrams of seventh order differentiators implemented according to prior art convention and according to the present invention, respectively. A comparison of these two drawings exemplifies the latency problems of the prior art and the solution of the present invention. In FIG. 7A, input signal $Y_7$ 200 is input into the differentiator in only one place. This means that $Y_7$ must propagate through seven adders 204, 208, 212, 216, 220, 226 and 230 before the term $Y_7$ (FIG. 2) is realized. The input $Y_7$ must go through one mire adder 236 when the output of the seventh order differentiator 198 is summed with the output 232 from the preceding differentiator. In total, $Y_7$ must propagate through eight circuit functions in one clock period before the differentiator output can be used. Due to the propagation delay of the adders, either a slow clock would have to be used, or additional delays would have to be put into the signal path, neither of which is desirable. In FIG. 7A, each of the adders 204, 208, 212, 2416, 220, 226, 230 combined with the respective inverting flip-flops 202, 206, 210, 214, 218, 224, 228, perform a differentiation. The output 234 of adder 230 is $Y_7(1-z^{-1})^7$, which is the left-hand side of equation (12) in FIG. 2.

Figure 7B:
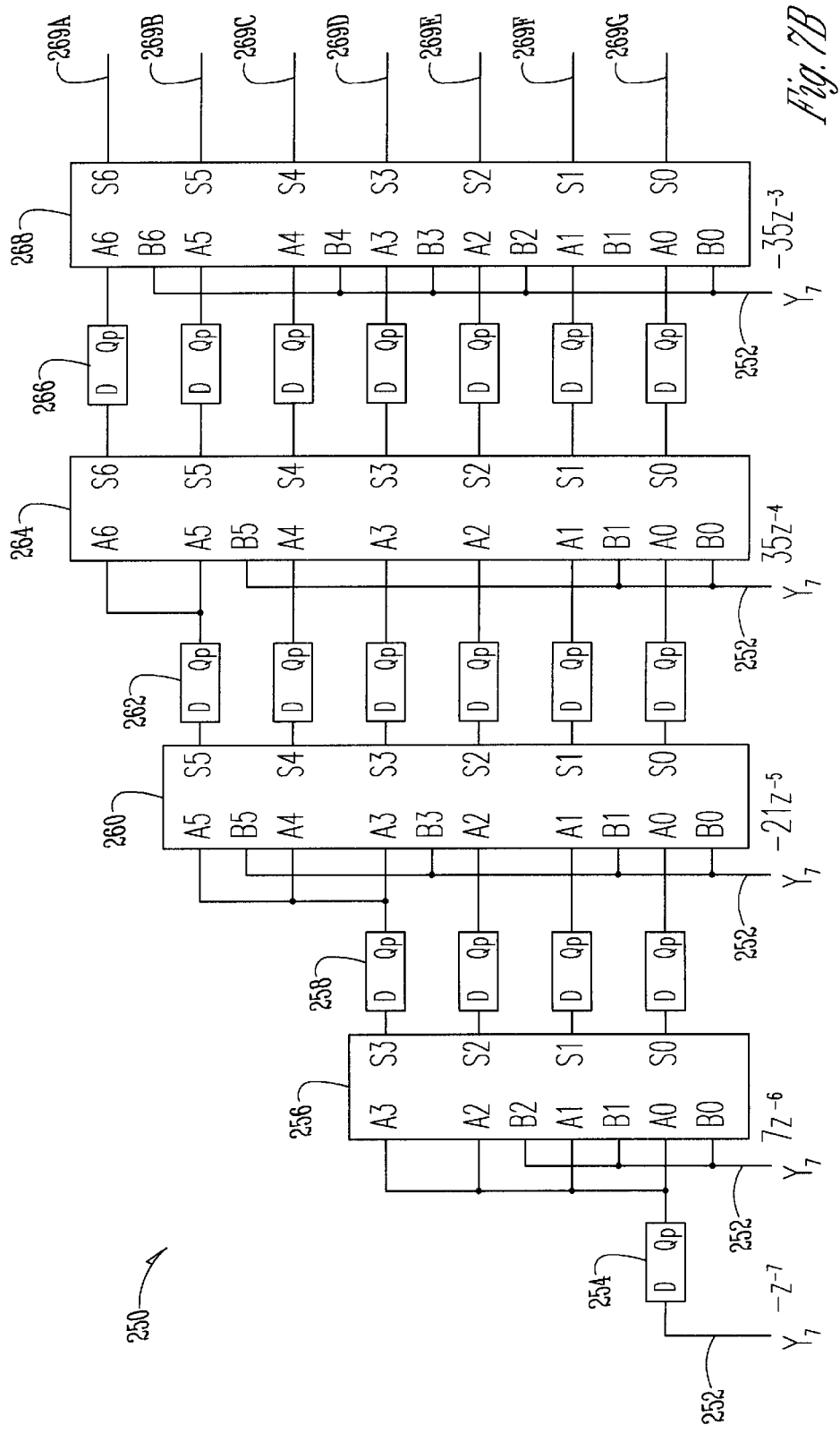
FIG. 7B is a schematic diagram of a seventh order differentiator implemented according to the present invention.
Figure 7B:
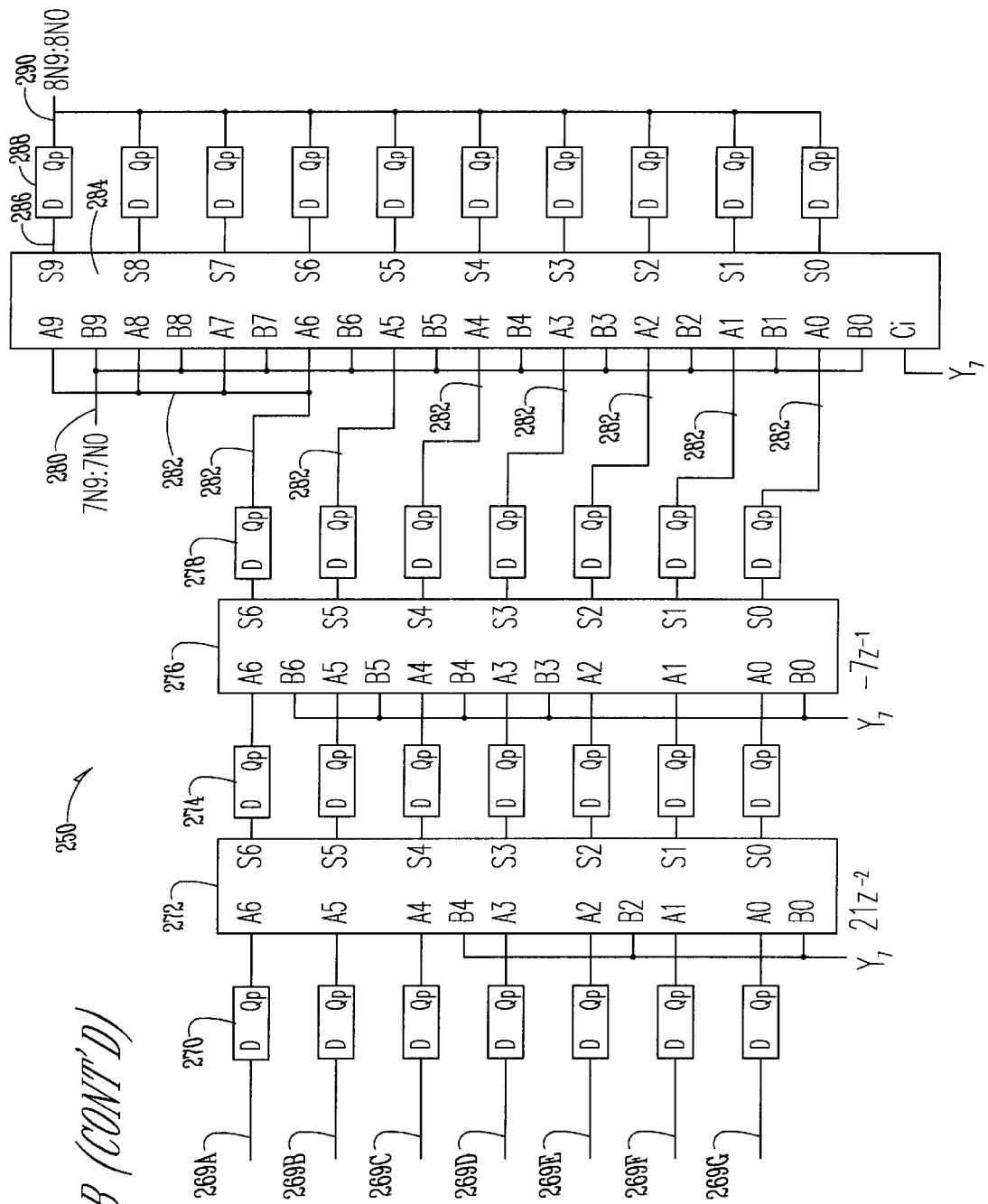

The solution to the latency problem is shown in FIG. 7B. The input signal $Y_7$ 252 is input in parallel into D flip-flop 254 and adders 256, 260, 264, 268, 272, 276, and 284. The term $1Y_7$ from equation (13) (FIG. 2) is realized by $Y_7$ being input at the carry input (Ci) of the last adder 284. Rather than having to propagate the signal through multiple adders in order to realize the term $1Y_7$, as in the prior art, $Y_7$ only has to propagate through adder 284. In addition, the outputs from all of the adders 256, 260, 264, 268, 272, 276 are input into the latches 258, 262, 266, 270, 274, and 278, respectively. Therefore, all signals in the differentiator 250 only pass through one circuit function during each clock period. Latching the output states of each of the adders allows a faster clock to be used, reducing latency.

The output of latch 254 is $Y_7z^{-1}$. To realize a coefficient of negative one at the input to adder 256, the output of latch 254 is input into bit positions A0–A3, realizing the two's complement of a negative one. Input signal $Y_7$ is also input into bit positions B0–B2 in adder 256. This gives a coefficient of seven which is multiplied by $Y_7$. The output of adder 256 is $7Y_7-Y_7z^{-1}$. This input is input into latches 258. The output of latches 258 is $7Y_7z^{-1}-Y_7z^{-2}$.

The two's complement of 21 is realized at adder 260, where $Y_7$ is input into bit positions B0, B1, B3, and B5. By this implicit multiplication adder 260 subtracts $21Y_7$ from the preceding output, yielding $-21Y_7+7Y_7z^{-1}-Y_7z^{-2}$. The output of adder 260 is input into latches 262. The output of latches 262 is $-21Y_7z^{-1}+7Y_7z^{-2}-Y_7z^{-3}$.

The output of latches 262 is input at adder 264. $Y_7$ is input into bit positions B0, B1, and B5 at adder 264. The input positions of $Y_7$ at adder 264 represent a coefficient of 35. Adder 264 adds $35Y_7$ to the input $-21Y_7z^{-1}+7Y_7z^{-2}-Y_7z^{-3}$. The output of adder 264 is input to the latches 266, multiplying the output of adder 264 by $z^{-1}$.

The output of latches 266 is $35Y_7z^{-1}-21Y_7z^{-2}+7Y_7z^{-3}-Y_7z^{-4}$. This output is input into adder 268. $Y_7$ is input into bit positions B0, B2–B4, and B6. When $Y_7$ is a 1, the two's complement of 35 (1011101) is realized. The output 269A–269G of adder 268 is $-35Y_7+35Y_7z^{-1}-21Y_7z^{-2}+7Y_7z^{-3}-Y_7z^{-4}$, which is input into latches 270. The output of latches 270 is $-35Y_7z^{-1}+35Y_7z^{-2}-1Y_7z^{-3}+7Y_7z^{-4}-Y_7z^{-5}$.

Signal $Y_7$ is input at bit positions B4, B2, and B0 at adder 272 to realize a coefficient of 21. The output of adder 272 is $21Y_7-35Y_7z^{-1}+35Y_7z^{-2}-21Y_7z^{-3}+7Y_7z^{-4}-Y_7z^{-5}$. The output of adder 272 is input into latches 274. The output of latches 274 is input into adder 276.

Signal $Y_7$ is input into adder 276 in bit position B0 and B3–B6. This input realizes a coefficient of −7. Adder 276 subtracts $7Y_7$ from the output of latches 274 ($21Y_7z^{-1}-35Y_7z^{-2}+35Y_7z^{-3}-21Y_7z^{-4}+7Y_7z^{-5}-Y_7z^{-6}$). The output of adder 276 is input into latches 278. The output of latches 278 is $-7Y_7z^{-1}+21Y_7z^{-2}-35Y_7z^{-3}+35Y_7z^{-4}-21Y_7z^{-5}+7Y_7z^{-6}-Y_7z^{-7}$.

The output of latches 278 is sign extended and input into adder 284 on input bits A9–A0. Signal $Y_7$ is input into the carry input bit (Ci) of adder 284 to realize the term $Y_7$. At this point, the seventh order differentiation of $Y_7$ is complete. The summation of the bits A9–A0 with the carry input yields $Y_7-7Y_7z^{-1}+21Y_7z^{-2}-35Y_7z^{-3}+35Y_7z^{-4}-21Y_7z^{-5}+7Y_7z^{-6}-Y_7z^{-7}$. As can be seen from equation (12) or (13) (FIG. 2), this is the output of a seventh order differentiator. The other input 280 into adder 284 is the summation of the integer control bits 28 and the output signals generated in the zero through sixth order differentiators. The output 286 of the adder 284 is input into latches 286. The output 290 of the latches 286 could be fed to the frequency divider 24 (FIG. 1).

Referring again to FIG. 1, it will be apparent to those skilled in the art that the integer control bits 28 can be summed with the differentiators' 92, 94, 100, 106 outputs 52, 54, 56, 58 at different points. Rather than summing the integer control bits 28 with the output of the first differentiator 92, the outputs 52, 54, 56, 58 of all the differentiators 92, 94, 100, 106 could be summed first and then added to the integer control bits 28.

It should also be understood that delays/latches 62, 66, 70 are used for signal synchronization, so that all signal paths realize the same number of delays. For example, input 50 will see delays in the third order differentiator 106. However, input signal 44 won't see any delays in the zero order differentiator 92. The delays 62, 66, 70 are inserted so that the output 52 of, the zero order differentiator 92 passes through the adders 60, 64, 68 and arrives at the last adder 72 at the same time as the corresponding signal 58 from the third order differentiator 106.

Applying superposition, it is apparent that the delays could be moved to other points in the signal path, as long as all signal paths realize the same number of delays. For example, three delays could be placed in the signal path between the output 52 of the zero order differentiator 96 and an adder used to sum the output 52, 54, 56, 58 of all four differentiators 92, 94, 100, 106. To ensure synchronization, two delays would need to be inserted into the signal path of the first order differentiator 94, one delay would be inserted into the path of the second order differentiator 100, and no additional delays would be inserted into the signal path of the third order differentiator. The delay 74 between the last adder 72 and the frequency divider 24 is used to control when the input 90 to the frequency divider is updated. It is not necessary to use delay 74.

The present invention has been described as it applies to specific exemplary embodiments. However, it is not intended that the present invention be limited to the described embodiments. It is intended that the invention cover all alternatives, modifications, and equivalents which may be included within the spirit and scope of the invention.

What is claimed is:

1. A method of reducing latency in an n'th order differentiator, the method comprising:

characterizing an output of the differentiator with a z-transform transfer function;

applying Horner's Rule to the transfer function to create a polynomial form of the transfer function; and implementing the polynomial form of the transfer function in hardware.

2. The method of claim 1, wherein the polynomial form of the transfer function is implemented by inputting an inputting an input signal source in parallel into at least one adder and at least one latch, and coefficients are realized by inputting the input signal into input positions based on the weight and sign of the coefficients.

3. The method of claim 2, wherein all signals in the differentiator will pass through only one circuit function in a sample period.

4. The method of claim 2, wherein the input signal is a carry bit of an accumulator.

5. The method of claim 1 wherein a are provided, the plurality of differentiators having an order of n, n−1, . . . 0, respectively, each differentiator connected to an input signal source.

6. The method of claim 5, wherein the input signal sources to the plurality of differentiators are carry bits from a plurality of accumulators.

7. The method of claim 1, wherein the order is greater than or equal to two.

8. The method of claim 1, wherein the order is greater than or equal to five.

9. An n'th order differentiator for reducing latency problems, comprising:

at least one adder having an input; and at least one latch having an input, wherein the inputs are connected in parallel to an input signal source, input positions being determined from a polynomial form of a z-transform transfer function of the differentiator.

10. The differentiator of claim 9, wherein coefficients are realized by connecting the input signal source into input positions based on the weight and sign of the coefficients.

11. The differentiator of claim 10, wherein all signals in the differentiator will pass through only one circuit function in a sample period.

12. The differentiator of claim 9, wherein the input signal source is, a carry bit of an accumulator.

13. The n'th order differentiator according to claim 9, comprising a plurality of differentiators having an order of n, n−1, . . . 0, respectively, each differentiator connected to an input signal source.

14. The n'th order differentiator of claim 13, wherein the input signal sources to the plurality of differentiators are carry bits from a plurality of accumulators.

15. The n'th differentiator according to claim 9, wherein the order is greater than or equal to two.

16. The n'th differentiator according to claim 9, wherein the order is greater than or equal to five.

17. A method of reducing latency in a frequency synthesizer having a phase-locked loop, and an n'th order MASH structure of sigma-delta modulators having n accumulators, the method comprising:

implementing a polynomial form of a z-transform transfer function for each of n differentiators in the MASH structure of sigma-delta modulators, the n differentiators having an order of n−1, n−2, . . . , 0.

18. The method of claim 17, wherein n is greater than or equal to two.

19. The method of claim 17, wherein the step of implementing the polynomial form of the transfer function comprises inputting n input signals into adders and a latch of each of the n differentiators, the number of latches and adders and input positions of input signals in each differentiator being dependent on the polynomial form of the z-transform transfer function of each differentiator.

20. The method of claim 19, wherein the n input signals are carry bits from the n accumulators.

21. The method of claim 20, further comprising:

summing integer control bits with an output of a zero order differentiator and performing successive summations with outputs of the remaining n−1 differentiators to produce a final sum; and inputting the final sum into a frequency divider of the phase-locked loop.

22. An n'th order MASH structure of sigma-delta modulators having n accumulators, comprising:

n differentiators, the order of the differentiators equal to n−1, n−2, . . . , 0, the differentiators having adders and latches;

a carry bit of each accumulator being connected to one differentiator; and the connection of inputs within each differentiator being arranged to realize a polynomial form of a z-transform transfer function of each of the n differentiators.

23. The MASH structure of sigma-delta modulators of claim 22, further comprising:

a phase-locked loop, wherein an output of the MASH structure is input into a frequency divider of the phase-locked loop.

24. A method of reducing latency in a circuit having at least one differentiator, the method comprising:

characterizing an output of at least one differentiator with a z-transform transfer function;

applying Horner's Rule to the transfer function to create a polynomial form of the transfer function; and implementing the polynomial form of the transfer function in hardware.

25. The method of claim 24, wherein the polynomial form of the transfer function is implemented by inputting an input signal in parallel into at least one Adder and at least one latch, and coefficients are realized by inputting the input signal into input positions based on the weight and sign of the coefficients.

26. The method of claim 25, wherein the circuit has a plurality of differentiators, the differentiators having an order of n, n−1, . . . , 0, respectively, at least one of the differentiators implemented by: characterizing an output of at least one differentiator with a z-transform transfer function;

applying Horner's Rule to the transfer function to create a polynomial form of the transfer function; and implementing the polynomial form of the transfer function in hardware.

27. The method of claim 26 wherein all of the differentiators are implemented by:

characterizing outputs of the differentiators with z-transform transfer functions;

applying Horner's Rule to the transfer functions to create a polynomial form of the transfer function for each of the differentiators; and implementing the polynomial form of the transfer function for each of the differentiators in hardware.

28. A circuit, having at least one differentiator, wherein at least one differentiator comprises:

at least one adder having an input; and at least one latch having an input, wherein the inputs are connected in parallel to an input signal source, input positions being determined from a polynomial form of a z-transform transfer function of the differentiator.

29. The differentiator of claim 28, wherein coefficients are realized by connecting the input signal source into input positions based on the weight and sign of the coefficients.

30. The circuit of claim 29, wherein the circuit has a plurality of differentiators, the differentiators having an order of n, n–i, . . . , 0, respectively, wherein at least one differentiator comprises:

at least one adder having an input; and at least one latch having an input, wherein the inputs are connected in parallel to an input signal source, input positions being determined from a polynomial form of a z-transform transfer function of the differentiator.

31. The circuit of claim 30, wherein each differentiator comprises:

at least one adder having an input; and at least one latch having an input, wherein the inputs are connected in parallel to an input signal source, input positions being determined from a polynomial form of a z-transform transfer function of each differentiator.

* * * * *